(12) United States Patent
Ogasahara et al.

(10) Patent No.: US 12,531,573 B2
(45) Date of Patent: Jan. 20, 2026

(54) SIGNAL PROCESSING APPARATUS, SIGNAL PROCESSING METHOD, AND RECORDING MEDIUM

(71) Applicant: NEC Corporation, Tokyo (JP)

(72) Inventors: Daisaku Ogasahara, Tokyo (JP); Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 94 days.

(21) Appl. No.: 18/658,328

(22) Filed: May 8, 2024

(65) Prior Publication Data

US 2024/0388307 A1    Nov. 21, 2024

(30) Foreign Application Priority Data

May 18, 2023   (JP) .................. 2023-082328

(51) Int. Cl.
*H03M 3/00* (2006.01)
(52) U.S. Cl.
CPC ............... *H03M 3/30* (2013.01); *H03M 3/37* (2013.01); *H03M 3/484* (2013.01); *H03M 3/50* (2013.01)
(58) Field of Classification Search
CPC ............ H03M 3/30; H03M 3/50; H03M 3/37; H03M 3/484; H03M 7/32
See application file for complete search history.

(56) References Cited

U.S. PATENT DOCUMENTS

2013/0021104 A1\*  1/2013  Schmidt ............... H03F 1/0288
                                                        330/124 R
2022/0239321 A1    7/2022  Hayama

FOREIGN PATENT DOCUMENTS

JP              7072734 B2     5/2022

\* cited by examiner

*Primary Examiner* — Joseph J Lauture
(74) *Attorney, Agent, or Firm* — Sughrue Mion, PLLC

(57) ABSTRACT

A processing apparatus includes: a distribution unit that divides an input signal into input signal blocks, and distributes, in dividing order, the divided input signal blocks to delta-sigma modulation circuits; a parallel circuit unit including the delta-sigma modulation circuits that perform delta-sigma modulation on the input signal blocks and output output signal blocks; and a coupling unit that couples the output signal blocks outputted from the parallel circuit unit, thereby to generate an output signal such that a first output signal block reflects a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

11 Claims, 12 Drawing Sheets

SIGNAL PROCESSING APPARATUS, SIGNAL PROCESSING METHOD, AND RECORDING MEDIUM

INCORPORATION BY REFERENCE

This application is based upon and claims the benefit of priority from Japanese Patent Application No. 2023-082328, filed on May 18, 2023, the disclosure of which is incorporated herein in its entirety by reference.

TECHNICAL FIELD

Example embodiments of this disclosure relate to technical fields of a signal processing apparatus, a signal processing method, and a recording medium that generate an output signal from an input signal by using a plurality of delta-sigma modulation circuits.

BACKGROUND ART

Patent Literature 1 describes an example of a signal processing apparatus that generates an output signal from an input signal by using a plurality of delta-sigma modulation circuits. Specifically, Patent Literature 1 describes a signal processing apparatus that divides an input signal into a plurality of input signal blocks, that processes the plurality of input signal blocks by using a plurality of delta-sigma modulation circuits to generate a plurality of output signal blocks, and that combine the plurality of output signal blocks to generate an output signal.

BACKGROUND ART DOCUMENTS

Patent Literature

[Patent Literature 1] Japanese Patent No. 7072734

SUMMARY

In a case where the input signal is divided into the plurality of input signal blocks and the plurality of output signal blocks, which are respectively generated from the plurality of input signal blocks by using the plurality of delta-sigma modulation circuits, are combined to generate the output signal, there is a possibility that the discontinuity of the signal is generated at a boundary of the plurality of output signal blocks. This is because, although two different delta-sigma modulation circuits are used to generate two output signal blocks from two temporally continuous input signal blocks, a circuit state of one delta-sigma modulation circuit that processes a signal block part at the end of a temporally preceding input signal block is not always the same as a circuit state of the other delta-sigma modulation circuit that processes a signal block part at the beginning of a subsequent input signal block.

In Patent Literature 1, in order to mitigate the discontinuity of the signal at the boundary of the plurality of output signal blocks, one of the two output signal blocks outputted by two different delta-sigma modulation circuits is selected as one output signal block that is actually used to generate the output signal, in accordance with a predetermined criterion. The method described in Patent Literature 1, however, uses a complicated criterion for conditional branching, and it may be thus hard to process the input signal at high speed.

It is an example object of this disclosure to provide a signal modulation apparatus and a signal modulation method that are capable of solving the above-described technical problems. By way of illustration, it is an example object of this disclosure to provide a signal processing apparatus, a signal processing method, and a recording medium that are capable of mitigating the discontinuity of a signal at the boundary of a plurality of output signal blocks.

A signal processing apparatus according to an example aspect of this disclosure is a signal processing apparatus that generates an output signal from an input signal, the signal processing apparatus including: a distribution unit that divides the input signal into a plurality of input signal blocks, each having a predetermined data length, and that distributes, in dividing order, the plurality of divided input signal blocks to a plurality of delta-sigma modulation circuits; a parallel circuit unit including the plurality of delta-sigma modulation circuits that perform delta-sigma modulation on the plurality of input signal blocks and that output a plurality of output signal blocks; and a coupling unit that couples the plurality of output signal blocks outputted from the parallel circuit unit, thereby to generate an output signal, wherein the signal processing apparatus generates the output signal such that a first output signal block included in the output signal reflects a result obtained from a first delta-sigma modulation circuit, which performs delta-sigma modulation on a first input signal block corresponding to the first output signal block included in the output signal, performing delta-sigma modulation on the first input signal block, and a state of a second delta-sigma modulation circuit that performs delta-sigma modulation on a second input signal block located immediately before or after the first input signal block.

A signal processing method according to an example aspect of this disclosure is a signal processing method that generates an output signal from an input signal, the signal processing method including: dividing the input signal into a plurality of input signal blocks, each having a predetermined data length; distributing, in dividing order, the plurality of divided input signal blocks to a plurality of delta-sigma modulation circuits that perform delta-sigma modulation on the plurality of input signal blocks and that output a plurality of output signal blocks; and coupling the plurality of output signal blocks outputted, thereby to generate an output signal, wherein the signal processing method generates the output signal such that a first output signal block included in the output signal reflects a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

A non-transitory recording medium recording thereon a computer program according to an example aspect of this disclosure is a computer program that allows a computer to execute a signal processing method that generates an output signal from an input signal, the signal processing method including: dividing the input signal into a plurality of input signal blocks, each having a predetermined data length; distributing, in dividing order, the plurality of divided input signal blocks to a plurality of delta-sigma modulation circuits that perform delta-sigma modulation on the plurality of input signal blocks and that output a plurality of output signal blocks; and coupling the plurality of output signal blocks outputted, thereby to generate an output signal, wherein the signal processing method generates the output signal such that a first output signal block included in the output signal reflects a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

EFFECT

According to the signal processing apparatus, the signal processing method, and the recording medium in the respective example aspects described above, it is possible to mitigate the discontinuity of the signal at the boundary of the plurality of output signal block.

EXAMPLE EMBODIMENTS

Hereinafter, a signal processing apparatus, a signal processing method, and a recording medium according to example embodiments will be described with reference to the drawings. In the following description, the signal processing apparatus, the signal processing method, and the recording medium according to the example embodiments will be described, by using a signal processing apparatus 1 to which the signal processing apparatus, the signal processing method, and the recording medium according to the example embodiments are applied. This disclosure, however, is not limited to the example embodiments described below.

<1> SIGNAL PROCESSING APPARATUS 1 IN FIRST EXAMPLE EMBODIMENT

Figure 1:
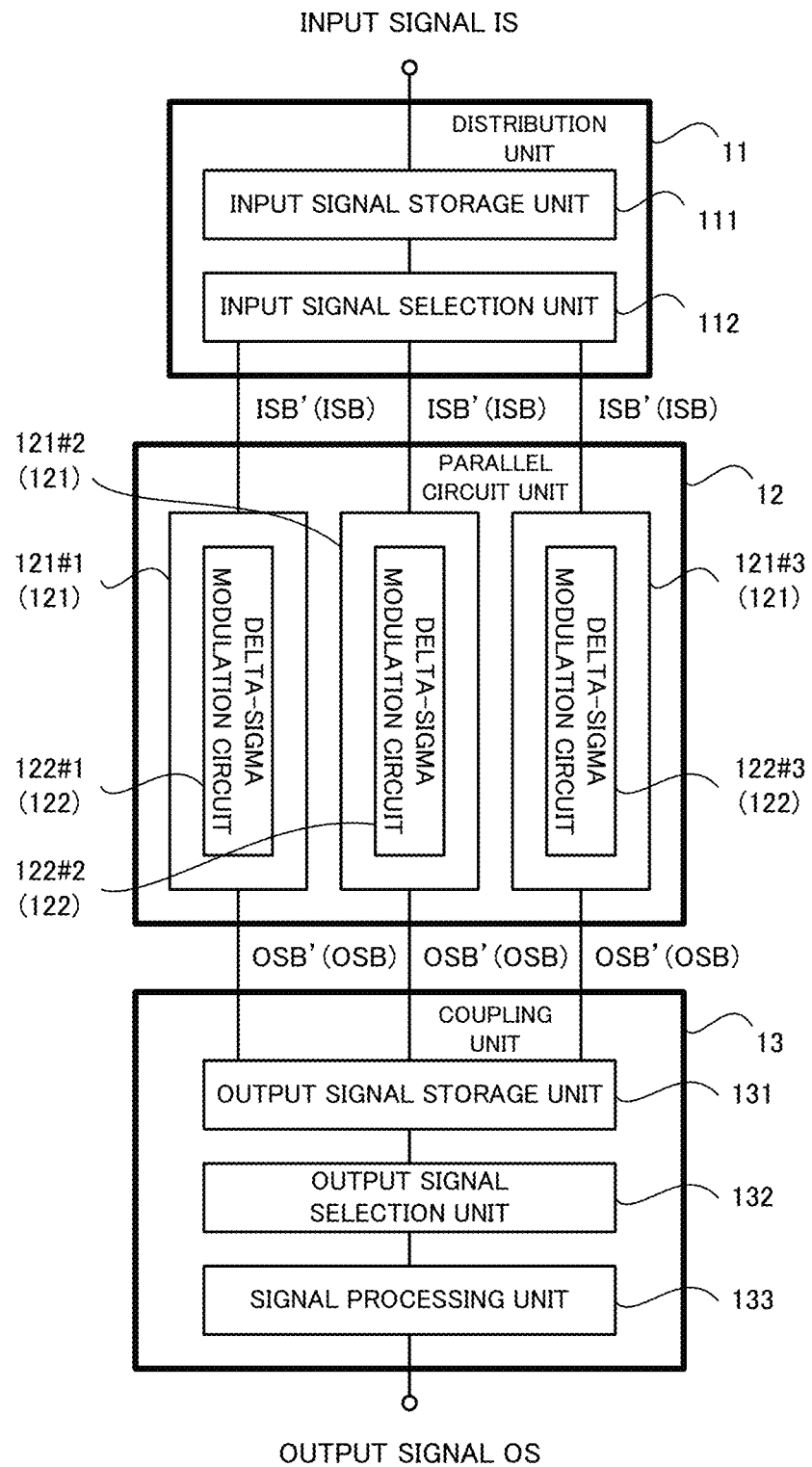
FIG. 1 is a block diagram illustrating a configuration of a signal processing apparatus in a first example embodiment.

First, with reference to FIG. 1, the signal processing apparatus 1 in the first example embodiment will be described. FIG. 1 is a block diagram illustrating a configuration of the signal processing apparatus 1 in the first example embodiment. In the following description, for convenience of description, the signal processing apparatus 1 in the first example embodiment will be referred to as a signal processing apparatus 1a.

As illustrated in FIG. 1, the signal processing apparatus 1a includes a distribution unit 11, a parallel circuit unit 12, and a coupling unit 13. The distribution unit 11 includes an input signal storage unit 111, and an input signal selection unit 112. The parallel circuit unit 12 includes a plurality of filter circuits 121. In the example illustrated in FIG. 1, the parallel circuit unit 12 includes three filter circuits 121 (specifically, filter circuits 121 #1, 121 #2, and 121 #3). In the following description, for convenience of description, an example in which the parallel circuit unit 12 includes three filter circuits 121 (specifically, the filter circuits 121 #1, 121 #2, and 121 #3) will be described. Each filter circuit 121 includes a delta-sigma modulation circuit 122. In the following description, for convenience of description, an example in which the three filter circuits 121 #1, 121 #2, and 121 #3 respectively include three delta-sigma modulation circuits 122 #1, 122 #2, and 122 #3, will be described. The coupling unit 13 includes an output signal storage unit 131, an output signal selection unit 132, and a signal processing unit 133.

The signal processing apparatus 1 is an apparatus that is configured to generate an output signal OS from an input signal IS. Each of the input signal IS and the output signal OS is a digital signal. The input signal IS is a multibit digital signal. That is, the input signal IS is a digital signal with a quantization bit number of 2 or more. On the other hand, the output signal OA is a 1-bit digital signal. That is, the output signal OS is a digital signal with a quantization bit number of 1.

The input signal IS is inputted to the distribution unit 11 to generate the output signal OS from the input signal IS. The input signal IS inputted to the distribution unit 11 is stored by the input signal storage unit 111. The input signal selection unit 112 divides the input signal IS stored in the input signal storage unit 111, into a plurality of input signal blocks ISB, each having a predetermined data length. For example, as illustrated in FIG. 2 schematically illustrating a plurality of input signal blocks ISB generated from the input signal IS, the input signal selection unit 112 may divide the input signal IS into an input signal block ISB #1, an input signal block ISB #2, an input signal block ISB #3, an input signal block ISB #4, an input signal block ISB #5, ..., and an input signal block ISB #N (where N is a variable indicating the number of the input signal blocks ISB).

The input signal selection unit 112 outputs the plurality of input signal blocks ISB to the parallel circuit unit 12. In particular, the input signal selection unit 112 outputs each input signal block ISB to one filter circuit 121 corresponding to each input signal block ISB of the plurality of filter circuits 121 provided in the parallel circuit unit 12. For example, as illustrated in FIG. 2, the input signal selection unit 112 may output the input signal block ISB #1 to the filter circuit 121 #1, may output the input signal block ISB #2 to the filter circuit 121 #2, may output the input signal block ISB #3 to the filter circuit 121 #3, and may output the input signal block ISB #4 to the filter circuit 121 #1. That is, the input signal selection unit 112 distributes, in dividing order, the plurality of divided input signal blocks ISB to the plurality of filter circuits 121.

Especially in the first example embodiment, when outputting one input signal block ISB to one filter circuit 121 corresponding to the one input signal block ISB, the input signal selection unit 112 adds, to the end of the one input signal block ISB, overlap data OD that are a part of another input signal block ISB located immediately after the one input signal block ISB. Thereafter, the input signal selection unit 112 outputs the one input signal block ISB to which the overlap data OD are added, to the one filter circuit 121 corresponding to the one input signal block ISB. That is, the input signal selection unit 112 outputs the overlap data OD that are a part of another input signal block ISB located immediately after one input signal block ISB, in addition to the one input signal block ISB, to the one filter circuit 121 corresponding to the one input signal block ISB. In other words, the input signal selection unit 112 outputs an input signal block ISB' including one input signal block ISB and the overlap data OD that are a part of another input signal block ISB located immediately after the one input signal block ISB, to one filter circuit 121 corresponding to the one input signal block ISB.

Figure 2:
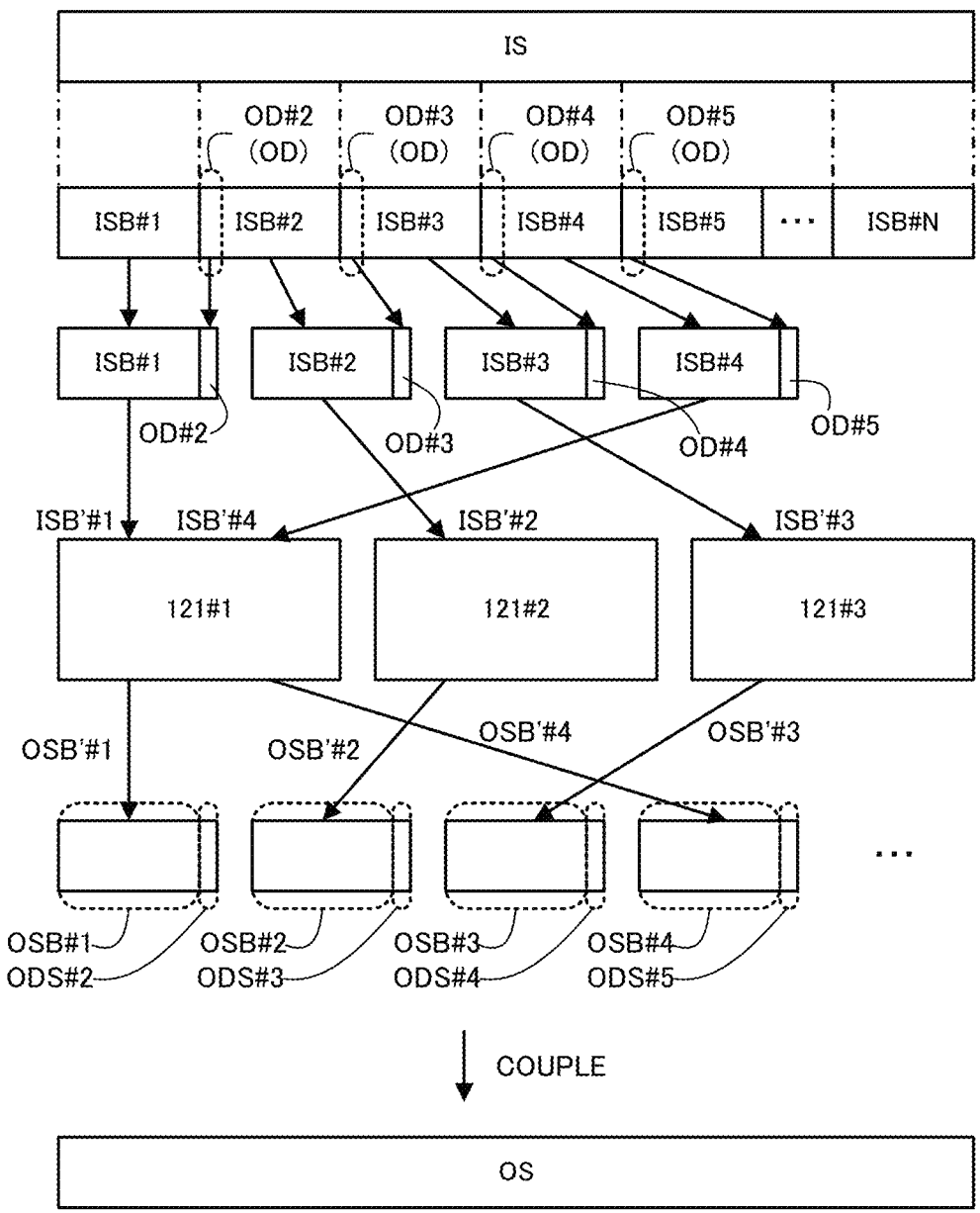
FIG. 2 schematically illustrates a process of a signal processing performed by the signal processing apparatus in the first example embodiment.

For example, as illustrated in FIG. 2, the input signal selection unit 112 may add overlap data OD #2 that are a part of the input signal block ISB #2, to the end of the input signal block ISB #1, and may output an input signal block ISB' #1 that is the input signal block ISB #1 to which the overlap data OD #2 are added, to the filter circuit 121 #1. For example, as illustrated in FIG. 2, the input signal selection unit 112 may add overlap data OD #3 that are a part of the input signal block ISB #3, to the end of the input signal block ISB #2, and may output an input signal block ISB' #2 that is the input signal block ISB #2 to which the overlap data OD #3 are added, to the filter circuit 121 #2. For example, as illustrated in FIG. 2, the input signal selection unit 112 may add overlap data OD #4 that are a part of the input signal block ISB #4, to the end of the input signal block ISB #3, and may output an input signal block ISB' #3 that is an input signal block ISB #3 to which the overlap data OD #4 are added, to the filter circuit 121 #3. For example, as illustrated in FIG. 2, the input signal selection unit 112 may add overlap data OD #5 that are a part of the input signal block ISB #5, to the end of the input signal block ISB #4, and may output an input signal block ISB' #4 that is the input signal block ISB #4 to which the overlap data OD #5 are added, to the filter circuit 121 #1.

The overlap data OD include a signal block part of the input signal block ISB, having a predetermined first length from the beginning of the input signal block ISB. For example, the overlap data may include a signal block part of a few samples (e.g., two to three samples) located at the beginning of the input signal block ISB, of the input signal block ISB. The signal block part of one sample included in the input signal block ISB may mean a signal block part with a size determined in accordance with sampling performed to generate the input signal that is a digital signal. Specifically, the signal block part of one sample may mean one piece of digital data having a predetermined bit width that is generated in one sampling.

Each filter circuit 121 processes the input signal block ISB' inputted to each filter circuit 121, by suing the delta-sigma modulation circuit 122 provided in each filter circuit 121. In the first example embodiment, "processing the input signal block ISB by using the delta-sigma modulation circuit 122" means "performing delta-sigma modulation on the input signal block ISB'." Specifically, each filter circuit 121 modulates the input signal block ISB' inputted to each filter circuit 121, by using the delta-sigma modulation circuit 122 provided in each filter circuit 121. Consequently, each filter circuit 121 generates an output signal block OSB' that is the modulated input signal block ISB'. For example, as illustrated in FIG. 2, the filter circuit 121 #1 may modulate the input signal block ISB' #1 by using the delta-sigma modulation circuit 122 #1. Consequently, the filter circuit 121 #1 may generate an output signal block OSB' #1 that is the modulated input signal block ISB' #1. For example, as illustrated in FIG. 2, the filter circuit 121 #2 may modulate the input signal block ISB' #2 by using the delta-sigma modulation circuit 122 #2. Consequently, the filter circuit 121 #2 may generate an output signal block OSB' #2 that is the modulated input signal block ISB' #2. For example, as illustrated in FIG. 2, the filter circuit 121 #3 may modulate the input signal block ISB' #3 by using the delta-sigma modulation circuit 122 #3. Consequently, the filter circuit 121 #3 may generate an output signal block OSB' #3 that is the modulated input signal block ISB' #3. For example, as illustrated in FIG. 2, the filter circuit 121 #1 may modulate the input signal block ISB' #4 by using the delta-sigma modulation circuit 122 #1. Consequently, the filter circuit 121 #1 may generate an output signal block OSB' #4 that is the modulated input signal block ISB' #4.

In a case where the plurality of input signal blocks ISB' are successively inputted to each filter circuit 121, each filter circuit 121 processes the input signal blocks ISB' successively inputted to each filter circuit 121, by using the delta-sigma modulation circuit 122 provided in each filter circuit 121. In addition, each filter circuit 121 resets a circuit state of the delta-sigma modulation circuit 122 provided in each filter circuit 121, before starting to process the new input signal block ISB'. For example, in the example illustrated in FIG. 2, the input signal block ISB' #1 is inputted to the filter circuit 121 #1, and then, the input signal block ISB' #4 is inputted to the filter circuit 121 #1. In this instance, the filter circuit 121 #1 may process the input signal block ISB' #1 by using the delta-sigma modulation circuit 122 #1. Thereafter, after the completion of the processing of the input signal block ISB' #1, the filter circuit 121 #1 resets the circuit state of the delta-sigma modulation circuit 122 #1. Thereafter, the filter circuit 121 #1 may process the input signal block ISB' #4 by using the delta-sigma modulation circuit 122 #1 whose circuit state is reset.

Figure 3:
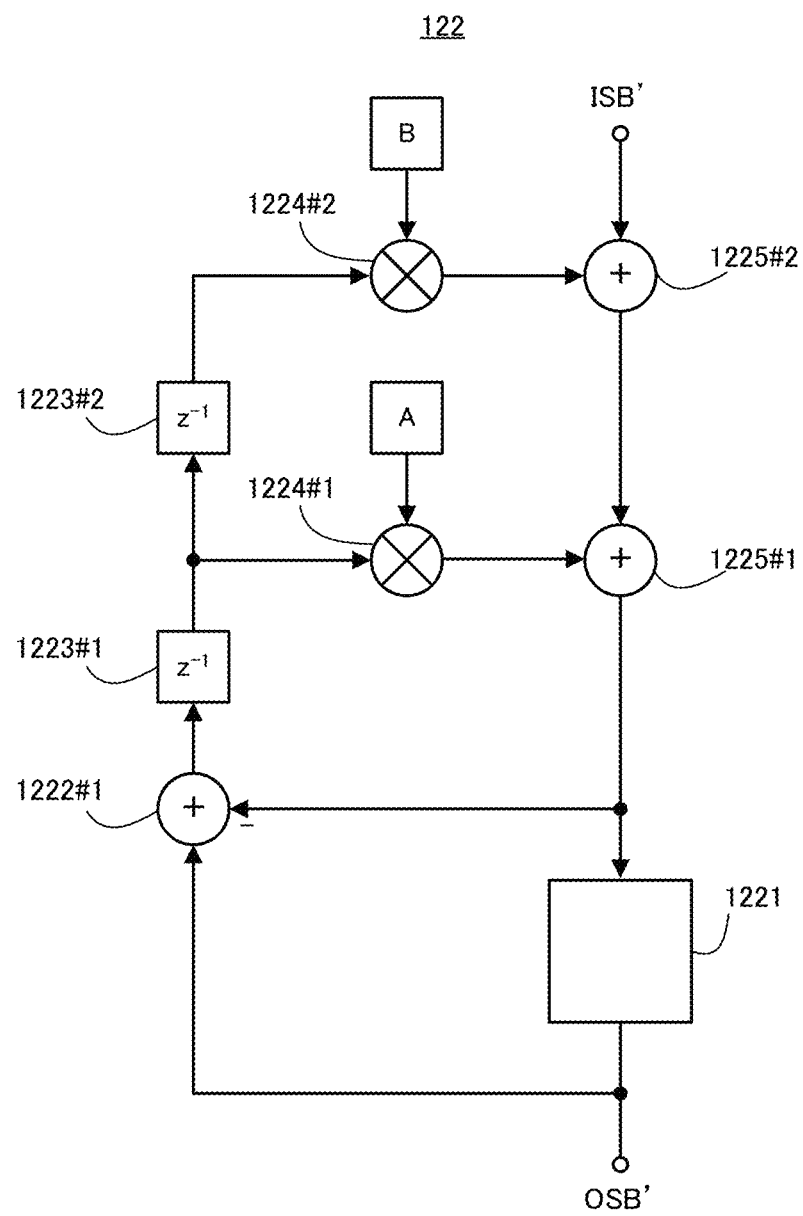
FIG. 3 is a block diagram illustrating an example of a configuration of a delta-sigma modulation circuit in the first example embodiment.

An example of the delta-sigma modulation circuit 122 is illustrated in FIG. 3. FIG. 3 illustrates an example in which a second-order error feedback type delta-sigma modulation circuit is used as the delta-sigma modulation circuit 122.

As illustrated in FIG. 3, the delta-sigma modulation circuit 122 includes a 1-bit quantizer 1221, a subtracter 1222 #1, a delay unit 1223 #1, a delay unit 1223 #2, a multiplier 1224 #1, a multiplier 1224 #2, an adder 1225 #1, and an adder 1225 #2. The input signal block ISB' inputted to the delta-sigma modulation circuit 122 is inputted to the 1-bit quantizer 1221 through the adders 1225 #1 and 1225 #2.

Each of the adders 1225 #1 and 1225 #2 adds a feedback signal to the input signal block ISB'. Therefore, the 1-bit quantizer 1221 generates the output signal block OSB' from the input signal block ISB' to which the feedback signal is added. The subtractor 1222 generates a difference signal indicating a difference between the output signal block OSB' outputted from the 1-bit quantizer 1221 and the input signal block ISB' inputted to the 1-bit quantizer 1221. The difference signal generated by the subtracter 1222 is stored in the delay unit 1223 #1 corresponding to a memory. The delay unit 1223 #1 outputs the stored difference signal to the multiplier 1224 #1 after a lapse of a delay time corresponding to one clock. The multiplier 1224 #1 multiplies the difference signal by a predetermined gain A, thereby to generate the feedback signal to be added to the input signal block ISB' in the adder 1225 #1. Furthermore, the difference signal outputted by the delay unit 1223 #1 is stored in the delay unit 1223 #2 corresponding to a memory. The delay unit 1223 #2 outputs the stored difference signal to the multiplier 1224 #2 after a lapse of a delay time corresponding to one clock. The multiplier 1224 #2 multiplies the difference signal by a predetermined gain B, thereby to generate the feedback signal to be added to the input signal block ISB' in the adder 1225 #2.

The circuit state of the delta-sigma modulation circuit 122 described above may include states of the delay units 1223 #1 and 1223 #2. In other words, the circuit state of the delta-sigma modulation circuit 122 may include a state of the difference signal stored by the delay unit 1223 #1 and a state of the difference signal stored by the delay unit 1223 #2. Resetting the circuit state of the delta-sigma modulation circuit 122 may mean resetting the difference signal stored by the delay unit 1223 #1 and the difference signal stored by the delay unit 1223 #2. Resetting the difference signal stored by each of the delay units 1223 #1 and 1223 #2 may mean setting a signal level of the difference signal stored by each of the delay units 1223 #1 and 1223 #2 to an initial value (e.g., zero).

Referring again to FIG. 1, a plurality of output signal blocks OSB' generated by the parallel circuit unit 12 are inputted to the coupling unit 13. The plurality of output signal blocks OSB' inputted to the coupling unit 13 are stored in the output signal storage unit 131. The output signal selection unit 132 reads out the plurality of output signal blocks OSB' stored in the output signal storage unit 131, and outputs the plurality of read output signal blocks OSB' to the signal processing unit 133 in order of the corresponding input signal blocks ISB. The signal processing unit 133 successively couples the plurality of output signal blocks OSB' inputted from the output signal selection unit 132, thereby to generate the output signal OS that is the plurality of output signal blocks OSB' that are coupled.

Here, especially in the first example embodiment, as described above, the input signal block ISB' that is the input signal block ISB to which the overlap data OD are added, is inputted to each delta-sigma modulation circuit 122 that generates the output signal block OSB'. That is, the input signal block ISB' including the input signal block ISB and the overlap data OD is inputted to each delta-sigma modulation circuit 122 that generates the output signal block OSB'. For this reason, as illustrated in FIG. 2, the output signal block OSB' includes an output signal block OSB generated by modulating the input signal block ISB, and an overlap signal ODS generated by modulating the overlap data OD. For example, as illustrated in FIG. 2, the output signal block OSB' #1 generated from the input signal block ISB #1' includes an output signal block OSB #1 generated by modulating the input signal block ISB #1 and an overlap signal ODS #2 generated by modulating the overlap data OD #2. For example, as illustrated in FIG. 2, the output signal block OSB' #2 generated from the input signal block ISB' #2 includes an output signal block OSB #2 generated by modulating the input signal block ISB #2 and an overlap signal ODS #3 generated by modulating the overlap data OD #3. For example, as illustrated in FIG. 2, the output signal block OSB' #3 generated from the input signal block ISB' #3 includes an output signal block OSB #3 generated by modulating the input signal block ISB #3 and an overlap signal ODS #4 generated by modulating the overlap data OD #4. For example, as illustrated in FIG. 2, the output signal block OSB' #4 generated from the input signal block ISB' #4 includes an output signal block OSB #4 generated by modulating the input signal block ISB #3 and an overlap signal ODS #5 generated by modulating the overlap data OD #5.

Figure 4:
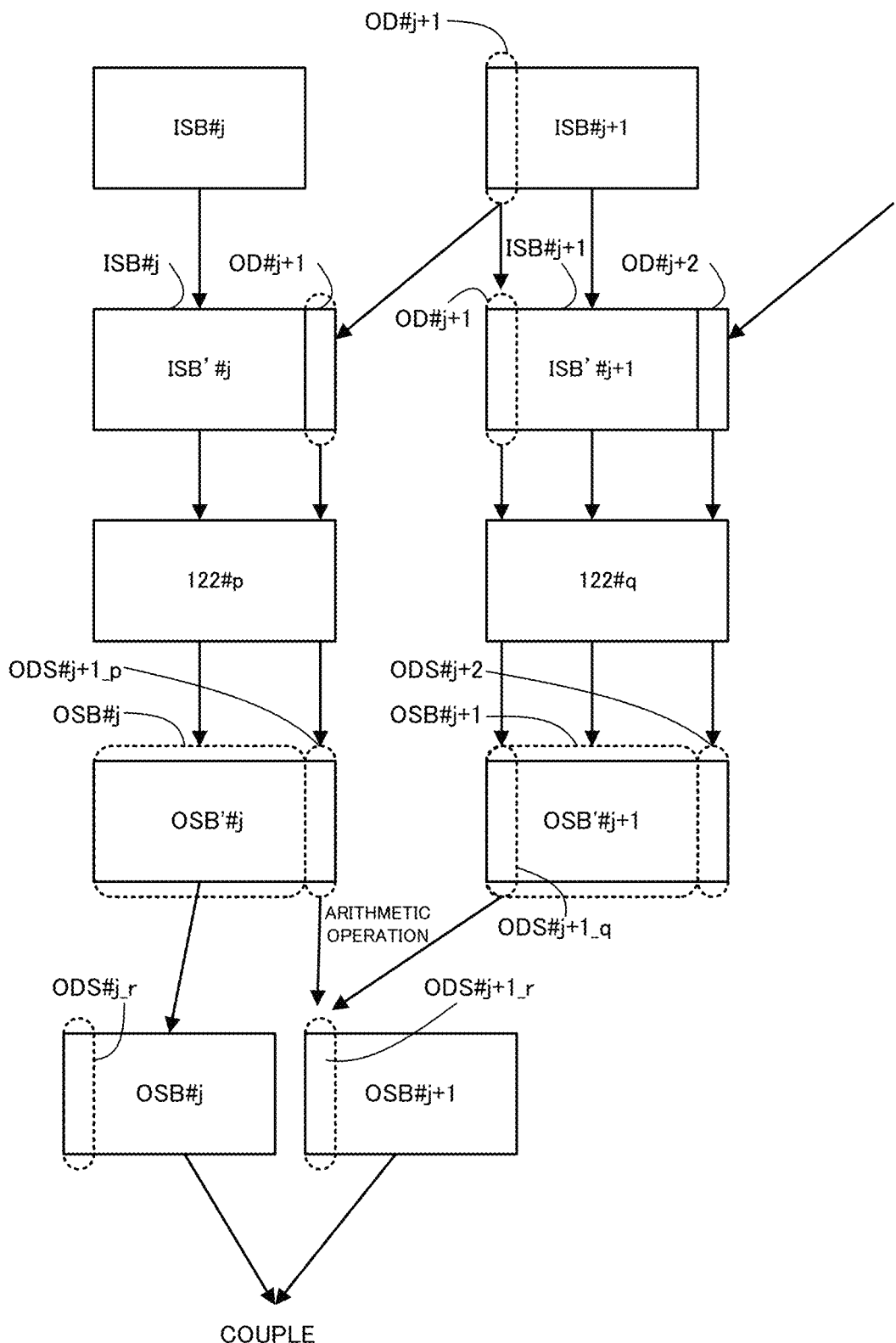
FIG. 4 schematically illustrates two output signal blocks respectively generated from two temporally continuous input signal blocks.

In this case, as illustrated in FIG. 4 schematically illustrating two output signal blocks OSB' #j and OSB' #j+1 respectively generated from two temporally continuous input signal blocks ISB' #j and ISB' #j+1 (where j is a variable indicating an integer that is greater than or equal to 1 and less than or equal to N−1), both the two output signal blocks OSB' #j and OSB' #j+1 include an overlap signal ODS #j+1 generated by modulating overlap data OD #j+1 of an input signal block ISB #j+1.

Specifically, as illustrated in FIG. 4, the input signal block ISB' #j that is the input signal block ISB #j to which the overlap data OD #j+1 are added, is modulated by one delta-sigma modulation circuit 122 corresponding to the input signal block ISB' #j. In the following description, the one delta-sigma modulation circuit 122 corresponding to the input signal block ISB' #j will be referred to as a delta-sigma modulation circuit 122 #p. In this case, the output signal block OSB' #j generated by the delta-sigma modulation circuit 122 #p includes an output signal block OSB #j generated by the delta-sigma modulation circuit 122 #p modulating the input signal block ISB #j, and the overlap signal ODS #j+1 generated by the delta-sigma modulation circuit 122 #p modulating the overlap data OD #j+1. In the following description, the overlap signal ODS #j+1 generated by the delta-sigma modulation circuit 122 #p modulating the overlap data OD #j+1, will be referred to as an overlap signal ODS #j+1_p.

On the other hand, as illustrated in FIG. 4, the input signal block ISB' #j+1 including the input signal block ISB #j+1 (and consequently also including the overlap data OD #j+1) is modulated by one delta-sigma modulation circuit 122 corresponding to the input signal block ISB' #j+1. In the following description, the one delta-sigma modulation circuit 122 corresponding to the input signal block ISB' #j+1, will be referred to as a delta-sigma modulation circuit 122 #q. In this case, the output signal block OSB' #j+1 generated by the delta-sigma modulation circuit 122 #q, includes an output signal block OSB #j+1 generated by the delta-sigma modulation circuit 122 #q modulating the input signal block ISB #j+1. Here, since the input signal block ISB #j+1 includes the overlap data OD #j+1, the output signal block OSB #j+1 includes the overlap signal ODS #j+1 generated by the delta-sigma modulation circuit 122 #q modulating the overlap data OD #j+1. In the following description, the overlap signal ODS #j+1 generated by the delta-sigma modulation circuit 122 #q modulating the overlap data OD #j+1, will be referred to as an overlap signal ODS #j+1_q.

In this instance, the signal processing unit 133 generates the output signal OS by using both the overlap signal ODS j+1_p, which is generated by the delta-sigma modulation circuit 122 #p modulating the overlap data OD #j+1, and the overlap signal ODS #j+1_q, which is generated by the delta-sigma modulation circuit 122 #q modulating the overlap data OD #j+1. Specifically, the signal processing unit 133 selects the output signal block OSB #j+1, which is generated by the delta-sigma modulation circuit 122 #q modulating the input signal block ISB #j+1, as the output signal block OSB that is a coupling target. The signal processing unit 133, however, replaces the overlap signal ODS #j+1_q of the output signal block OSB #j+1 with an overlap signal ODS #j+1_r calculated by an arithmetic operation using the overlap signal ODS #j+1_p and the overlap signal ODS #j+1_q. Specifically, the signal processing unit 133 may generate the overlap signal ODS #j+1_r by performing the arithmetic operation using the overlap signal ODS #j+1_p and the overlap signal ODS #j+1_q, may then quantize the overlap signal ODS #j+1_r to 1 bit as required, and may then replace the overlap signal ODS #j+1_q with the overlap signal ODS #j+1_r.

As an example of the overlap signal ODS #j+1_r, an average value/mean value of the overlap signal ODS #j+1_p and the overlap signal ODS #j+1_q may be used. The average value/mean value of the overlap signal ODS #j+1_p and the overlap signal ODS #j+1_q may be a simple average value of the overlap signal ODS #j+1_p and the overlap signal ODS #j+1_q. The average value/mean value of the overlap signal ODS #j+1_p and the overlap signal ODS #j+1_q may be a weighted average value/mean value of the overlap signal ODS #j+1_p and the overlap signal ODS #j+1_q. In a case where the weighted average value/mean value is used, a weight of the overlap signal ODS #j+1_p may be smaller than a weight of the overlap signal ODS #j+1_q. In a case where the weight of the overlap signal ODS #j+1_p is smaller than the weight of the overlap signal ODS #j+1_q, the overlap signal ODS #j+1_r is a signal in which the overlap signal ODS #j+1_q is more strongly reflected.

In this instance, as illustrated in FIG. 4, the signal processing unit 133 couples the output signal block OSB #j in which the overlap signal ODS #j_q is replaced with the overlap signal ODS #j_r and the output signal block OSB #j+1 in which the overlap signal ODS #j+1_q is replaced with the overlap signal ODS #j+1_r, thereby to generate the output signal OS. In this case, when the output signal block OSB #j+1_q in which the overlap signal ODS #j+1_q is replaced with the overlap signal ODS #j+1_r is coupled with the output signal block OSB #j, the discontinuity of the signal at a boundary between the output signal block OSB #j and the output signal block OSB #j+1 is mitigated, as compared with a case where the output signal block OSB #j+1 in which the overlap signal ODS #j+1_q is not replaced with the overlap signal ODS #j+1_r, is coupled with the output signal block OSB #j. This is because, in a case where the overlap signal ODS #j+1_q is replaced with the overlap signal ODS #j+1_r, the signal block part at the beginning of the output signal block OSB #j+1 (specifically, the overlap signal ODS #j+1_r) substantially reflects the circuit state of the delta-sigma modulation circuit 122 #p that generates the output signal block OSB #j. That is, in the first example embodiment, the signal processing apparatus 1a generates the output signal block OSB #j+1 by using both the overlap signals 122 #q+1_p and ISB #j+1_q, in order to generate the output signal block OSB #j+1 that reflects a result obtained from the delta-sigma modulation circuit 122 #q processing the input signal block ISB #j+1 (i.e., the output signal block OSB #j+1) and the circuit state of the delta-sigma modulation circuit 122 #p that processes the input signal block ISB #j located immediately before the input signal block ISB #j+1.

Note that the discontinuity of the signal leads to a calculation error of the output signal OS. The calculation error of the output signal OS may mean an error in an actual output signal OS generated by respectively processing the input signal IS that is divided (i.e., the plurality of input signal blocks ISB) by using the plurality of delta-sigma modulation circuits 122, with respect to an ideal output signal OS generated by processing the input signal IS that is not divided, by using a single delta-sigma modulation circuit 122. In this instance, if the discontinuity of the signal is mitigated, the calculation error of the output signal OS is reduced. Therefore, the signal processing apparatus 1a in the first example embodiment is allowed to reduce the calculation error of the output signal OS, as compared with a signal processing apparatus in a first comparative example in which a plurality of output signal blocks OSB respectively generated by the plurality of delta-sigma modulation circuits 122 are coupled as they are.

Figure 5A:
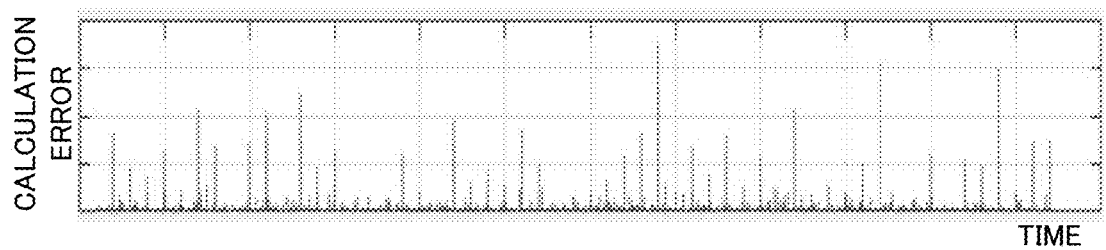
FIG. 5A is a graph illustrating a calculation error of an output signal generated by a signal processing apparatus in a first comparative example.
Figure 5B:
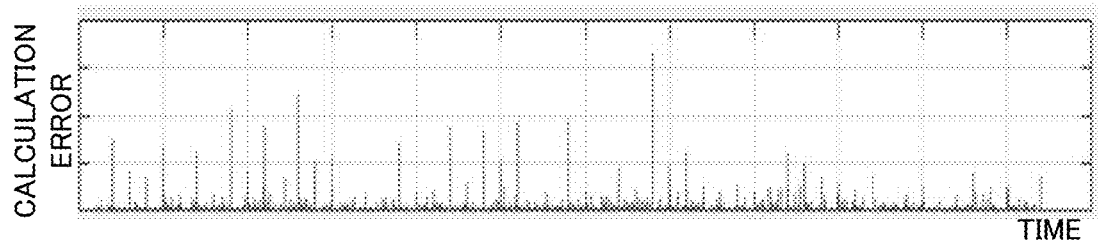
FIG. 5B is a graph illustrating a calculation error of an output signal generated by the signal processing apparatus in the first example embodiment.

As an example, FIG. 5A is a graph illustrating the calculation error of the output signal OS generated by the signal processing apparatus in the first comparative example, and FIG. 5B is a graph illustrating the calculation error of the output signal OS generated by the signal processing apparatus in the first example embodiment. As is seen in FIG. 5A and FIG. 5B, as compared with the calculation error of the output signal OS generated by the signal processing apparatus in the first comparative example, the calculation error of the output signal OS generated by the signal processing apparatus 1a in the first example embodiment is reduced. A reduction in the calculation error may include at least one of a reduction in frequency of occurrence of the calculation error and a reduction in a magnitude of the calculation error.

<2> SIGNAL PROCESSING APPARATUS 1 IN SECOND EXAMPLE EMBODIMENT

Figure 6:
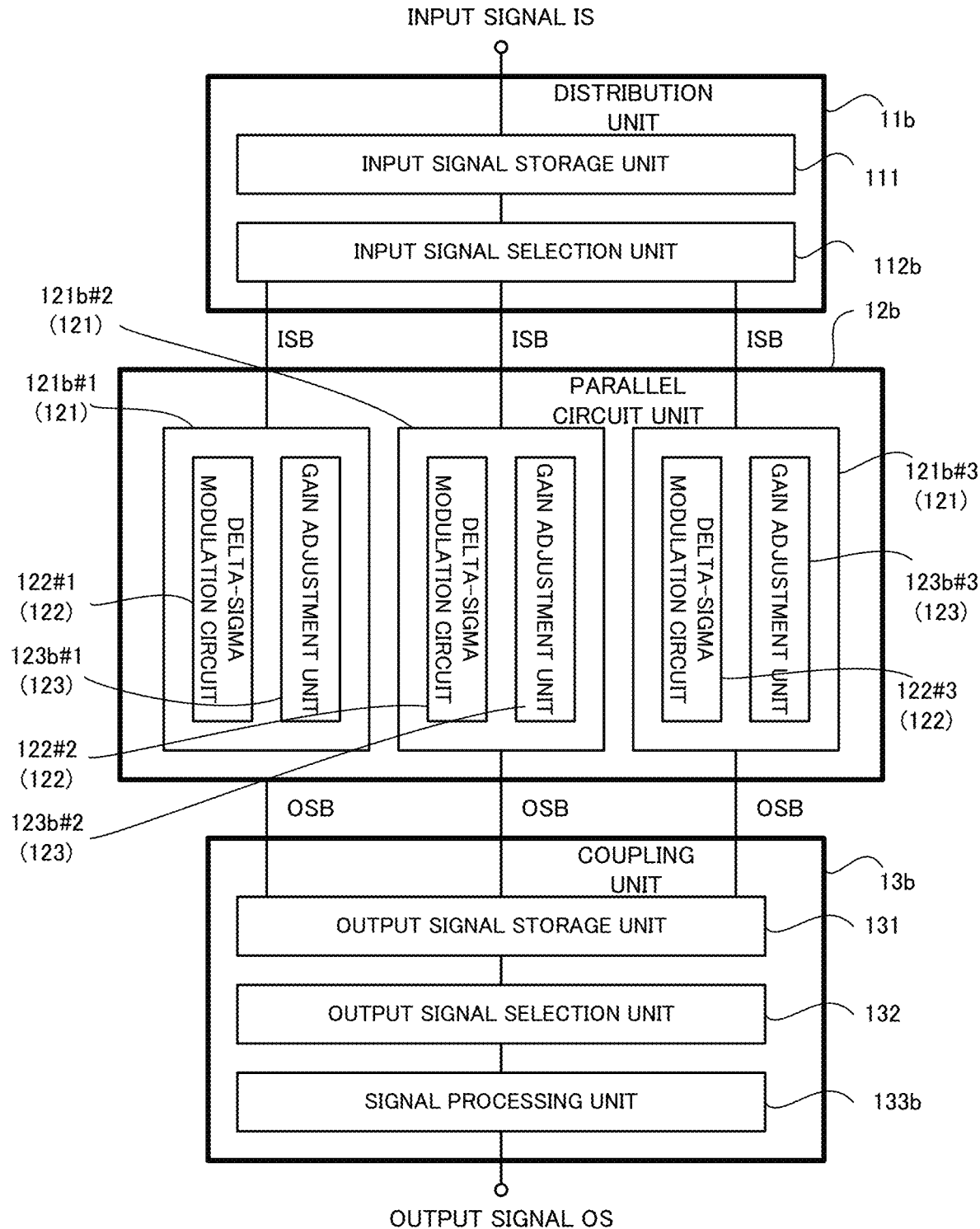
FIG. 6 is a block diagram illustrating a configuration of a signal processing apparatus in a second example embodiment.

Next, with reference to FIG. 6, the signal processing apparatus 1 in a second example embodiment will be described. FIG. 6 is a block diagram illustrating a configuration of the signal processing apparatus 1 in the second example embodiment. In the following description, for convenience of description, the signal processing apparatus 1 in the second example embodiment will be referred to as a signal processing apparatus 1b. In the following description, the components described in the first example embodiment carry the same reference numerals and a detailed description thereof will be omitted.

Figure 7:
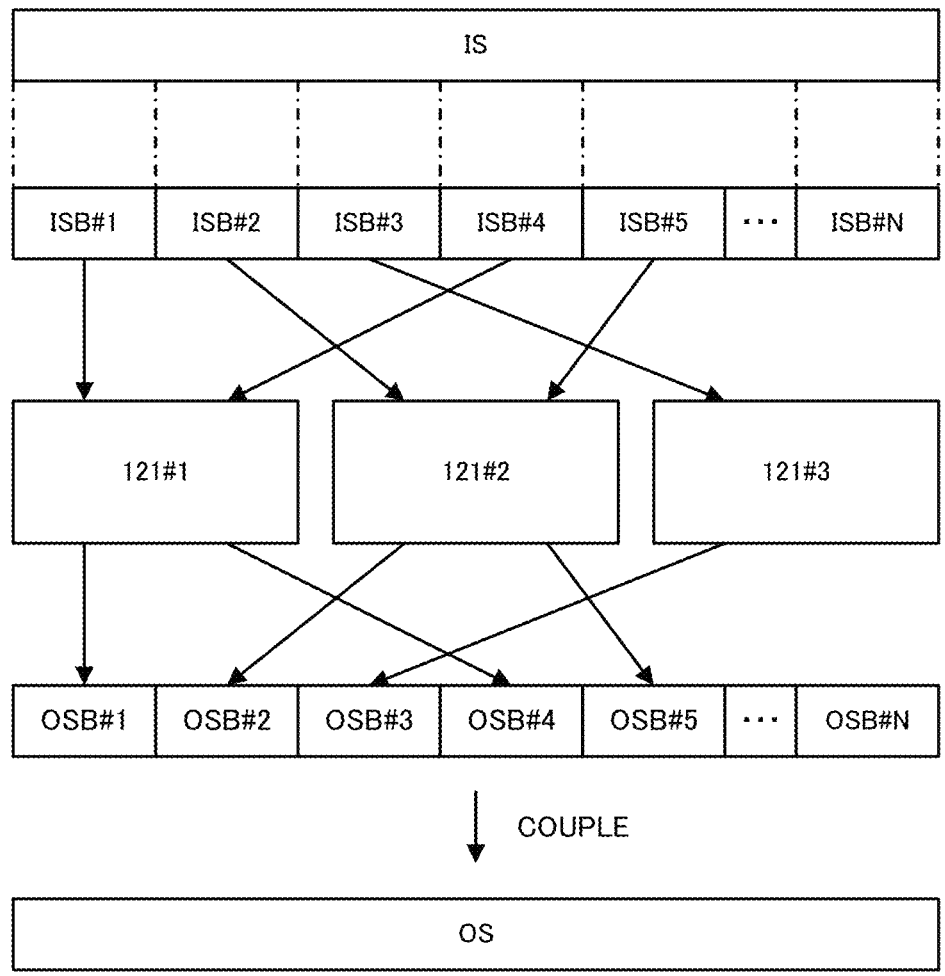
FIG. 7 schematically illustrates a process of a signal processing performed by the signal processing apparatus in the second example embodiment.

As illustrated in FIG. 6, the signal processing apparatus 1b includes a distribution unit 11b, a parallel circuit unit 12b, and a coupling unit 13b. The distribution unit 11b is different from the distribution unit 11 in the first example embodiment described above, in that it includes an input signal selection unit 112b, instead of the input signal selection unit 112. Other features of the distribution unit 11b may be the same as those of the distribution unit 11 in the first example embodiment described above. The input signal selection unit 112b is different from the input signal selection unit 112 in the first example embodiment described above, in that, when outputting one input signal block ISB to one filter circuit 121 corresponding to the one input signal block ISB, it does not need to add the overlap data OD that are a part of another input signal block ISB located immediately after the one input signal block ISB, to the end of the one input signal block ISB, as illustrated in FIG. 7. That is, the input signal selection unit 112b is different from the input signal selection unit 112 in the first example embodiment described above, in that it outputs the input signal block ISB to the filter circuit 121, instead of the input signal block ISB' including the input signal block ISB and the overlap data OD. For example, as illustrated in FIG. 7, the input signal selection unit 112 may output the input signal block ISB #1 to the filter circuit 121 #1. For example, as illustrated in FIG. 7, the input signal selection unit 112 may output the input signal block ISB #2 to the filter circuit 121 #2. For example, as illustrated in FIG. 7, the input signal selection unit 112 may output the input signal block ISB #3 to the filter circuit 121 #3. For example, as illustrated in FIG. 7, the input signal selection unit 112 may output the input signal block ISB #4 to the filter circuit 121 #1. For example, as illustrated in FIG. 7, the input signal selection unit 112 may output the input signal block ISB #5 to the filter circuit 121 #2. Other features of the input signal selection unit 112b may be the same as those of the input signal selection unit 112 in the first example embodiment described above.

Referring again to FIG. 6, the parallel circuit unit 12b is different from the parallel circuit unit 12 in the first example embodiment described above, in that it includes a plurality of filter circuits 121b, instead of the plurality of filter circuits 121. The filter circuit 121b is different from the filter circuit 121 in the first example embodiment described above, in that it includes a gain adjustment unit 123b. In the following description, for convenience of description, an example in which the three filter circuits 121 #1, 121 #2 and 121 #3 respectively include three gain adjustment units 123b #1, 123 #2 and 123 #3, will be described. Other features of the parallel circuit unit 12b may be the same as those of the parallel circuit unit 12 in the first example embodiment described above.

Each gain adjustment unit 123b adjusts a gain that is used to control a magnitude of the difference signal in one delta-sigma modulation circuit 122 corresponding to each gain adjustment unit 123b. For example, in a case where the delta-sigma modulation circuit 122 illustrated in FIG. 3 is used, each gain adjustment unit 123b may adjust at least one of a gain A and a gain B that is used to control the magnitude of the difference signal in one delta-sigma modulation circuit 122 corresponding to each gain adjustment unit 123b. Since the feedback signal is generated from the difference signal, each gain adjustment unit 123b may be considered to adjust the gain that is used to control a magnitude of the feedback signal in one of the delta-sigma modulation circuit 122 corresponding to each gain adjustment unit 123b.

Figure 8:
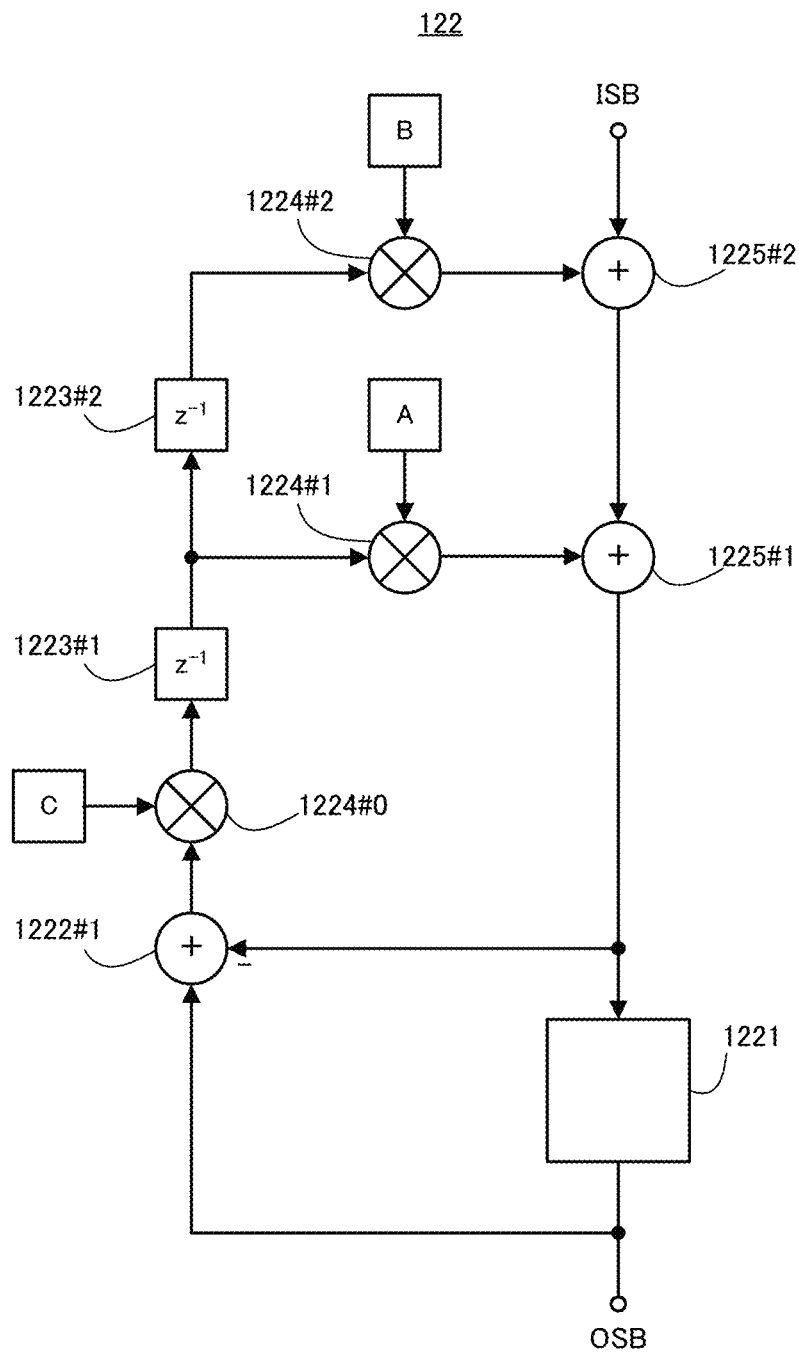
FIG. 8 is a block diagram illustrating an example of a configuration of a delta-sigma modulation circuit in the second example embodiment.

In the second example embodiment, instead of the delta-sigma modulation circuit 122 illustrated in FIG. 3, the delta-sigma modulation circuit 122 illustrated in FIG. 8 may be used. The delta-sigma modulation circuit 122 illustrated in FIG. 8 is different from the delta-sigma modulation circuit 122 illustrated in FIG. 3, in that it may include a multiplier 1224 #0, in addition to or instead of at least one of the multipliers 1224 #1 and 1224 #2. In this case, the difference signal generated by the subtracter 1222 may be multiplied by a predetermined gain C by the multiplier 1224 #0. The difference signal multiplied by the gain C may be stored in the delayer 1223 #1. Other features of the delta-sigma modulation circuit 122 illustrated in FIG. 8 may be the same as those of the delta-sigma modulation circuit 122 illustrated in FIG. 3.

As illustrated in FIG. 8, in a case where the delta-sigma modulation circuit 122 including the multiplier 1224 #0 is used in addition to or instead of at least one of the multipliers 1224 #1 and 1224 #2, each gain adjustment unit 123b may adjust the gain C that is used to control the magnitude of the difference signal by one delta-sigma modulation circuit 122 corresponding to each gain adjustment unit 123b, in addition to or instead of at least one of the gain A and the gain B.

Figure 9:
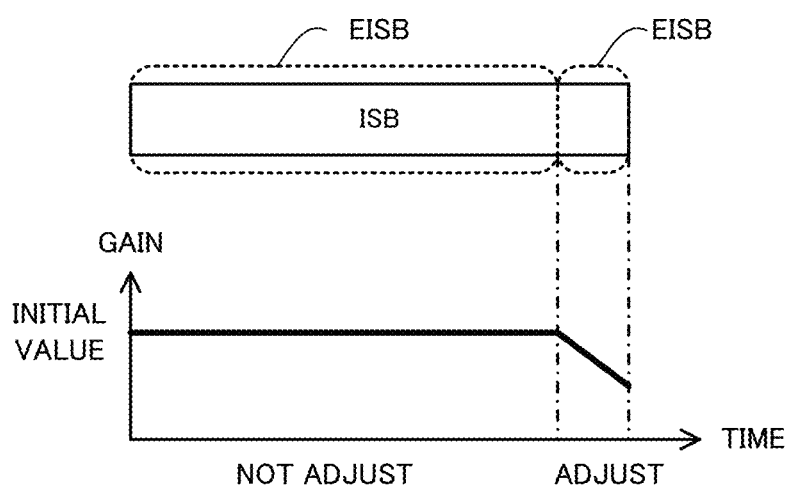
FIG. 9 illustrates a relation between an input signal block and a gain.

In the second example embodiment, the gain adjustment unit 123b may adjust the gain in a case where the delta-sigma modulation circuit 122 processes an end signal block part EISB that is a signal block part of the input signal block ISB, having a predetermined second length from the end of the input signal block ISB, as illustrated in FIG. 9 illustrating a relation between the input signal block ISB and the gain. That is, the gain adjustment unit 123b may adjust the gain such that the gain is a value that is different from an initial value, in a case where the delta-sigma modulation circuit 122 processes the end signal block part EISB. The end signal block part EISB may include a signal block part of several samples (e.g., four to five samples) located at the end of the input signal block ISB, of the input signal block ISB. On the other hand, as illustrated in FIG. 9, the gain adjustment unit 123b may not adjust the gain in a case where the delta-sigma modulation circuit 122 processes a signal block part NISB of the input signal block ISB other than the end signal block part EISB. That is, the gain adjustment unit 123b may maintain the gain at the initial value in a case where the delta-sigma modulation circuit 122 processes the signal block part NISB.

The gain adjustment unit 123b may adjust the gain that is used by one delta-sigma modulation circuit 122 such that the circuit state of one delta-sigma modulation circuit 122 that processes the end signal block part EISB of one input signal block ISB, is brought closer to an initial state (i.e., the reset circuit state) of another delta-sigma modulation circuit 122 that processes another input signal block ISB located immediately after the one input signal block ISB. For example, as described above, in a case where a state in which an initial signal whose signal level is the initial value (e.g., zero) is stored in each of the delay units 1223 #1 and 1223 #2 as the difference signal, is used as the initial state of the delta-sigma modulation circuit 122, the gain adjustment unit 123b may adjust the gain such that the gain that is used when the delta-sigma modulation circuit 122 processes the end signal block part EISB is smaller than the initial value of the gain, as illustrated in FIG. 9. As the gain is smaller, the signal level of the difference signal stored in each of the delay units 1223 #1 and 1223 #2 is lower. Therefore, as the gain is smaller, the circuit state of one delta-sigma modulation circuit 122 that processes the end signal block part EISB is brought closer to the initial state of the other delta-sigma modulation circuit 122.

Referring again to FIG. 6, the coupling unit 13b is different from the coupling unit 13 in the first example embodiment described above, in that it includes a signal processing unit 133b, instead of the signal processing unit 133. Other features of the coupling unit 13b may be the same as those of the coupling unit 13 in the first example embodiment described above.

Here, in the second example embodiment, since the plurality of input signal blocks ISB are inputted to the parallel circuit unit 12b, the parallel circuit unit 12b generates a plurality of output signal blocks OSB, instead of the plurality of output signal blocks OSB'. Therefore, in the second example embodiment, instead of the plurality of output signal blocks OSB', the plurality of output signal blocks OSB are inputted to the coupling unit 13b. For example, as illustrated in FIG. 7, the filter circuit 121 #1 may modulate the input signal block ISB #1 by using the delta-sigma modulation circuit 122 #1. Consequently, the filter circuit 121 #1 may output the output signal block OSB #1 that is the modulated input signal block ISB #1, to the coupling unit 13b. For example, as illustrated in FIG. 7, the filter circuit 121 #2 may modulate the input signal block ISB #2 by using the delta-sigma modulation circuit 122 #2. Consequently, the filter circuit 121 #2 may output the output signal block OSB #2 that is the modulated input signal block ISB #2, to the coupling unit 13b. For example, as illustrated in FIG. 7, the filter circuit 121 #3 may modulate the input signal block ISB #3 by using the delta-sigma modulation circuit 122 #3. Consequently, the filter circuit 121 #3 may output the output signal block OSB #3 that is the modulated input signal block ISB #3, to the coupling unit 13b. For example, as illustrated in FIG. 7, the filter circuit 121 #1 may modulate the input signal block ISB #4 by using the delta-sigma modulation circuit 122 #1. Consequently, the filter circuit 121 #1 may output the output signal block OSB #4 that is the modulated input signal block ISB #4, to the coupling unit 13b. For example, as illustrated in FIG. 7, the filter circuit 121 #2 may modulate the input signal block ISB #5 by using the delta-sigma modulation circuit 122 #2. Consequently, the filter circuit 121 #2 may output the output signal block OSB #5 that is the modulated input signal block ISB #5, to the coupling unit 13b.

In this case, the plurality of output signal blocks OSB inputted to the coupling unit 13b are stored in the output signal storage unit 131. The output signal selection unit 132 reads out the plurality of output signal blocks OSB stored in the output signal storage unit 131, and outputs the plurality of read output signal blocks OSB to the signal processing unit 133b in order of the corresponding input signal blocks ISB. The signal processing unit 133b successively couples the plurality of output signal blocks OSB inputted from the output signal selection unit 132, thereby to generate the output signal OS that is the plurality of output signal blocks OSB that are coupled.

Here, in the second example embodiment, as described above, the gain of one delta-sigma modulation circuit 122 is adjusted such that the circuit state of the one delta-sigma modulation circuit 122 that processes the end signal block part EISB of one input signal block ISB is brought closer to the initial state of another delta-sigma modulation circuit 122 that processes another input signal block ISB located immediately after the one input signal block ISB. In this instance, the discontinuity of the signal is mitigated at the boundary between one output signal block ISB generated from the one input signal block OSB and another output signal block OSB generated from the other input signal block ISB, as compared with a case where the gain is not adjusted. As described above, a cause of the discontinuity of the signal is that the circuit state of one delta-sigma modulation circuit 122 that processes the end signal block part EISB of a temporally preceding input signal block ISB is not the same as the circuit state of another delta-sigma modulation circuit 122 that processes the signal block part at the beginning of another subsequent input signal block ISB (i.e., the initial state of the other delta-sigma modulation circuit 122). In the second example embodiment, the circuit state of one delta-sigma modulation circuit 122 that processes the end signal block part EISB of a temporally preceding input signal block ISB is brought closer to the circuit state of another delta-sigma modulation circuit 122 that processes the signal block part at the beginning of another subsequent input signal block ISB (i.e., the initial state of the other delta-sigma modulation circuit 122). As a result, the discontinuity of the signal is mitigated.

When the discontinuity of the signal is mitigated, the calculation error of the output signal OS is reduced, as described above. Therefore, the signal processing apparatus 1b in the second example embodiment is allowed to reduce the calculation error of the output signal OS, as compared with a signal processing apparatus in a second comparative example in which the gain of the delta-sigma modulation circuit 122 is not adjusted.

Figure 10A:
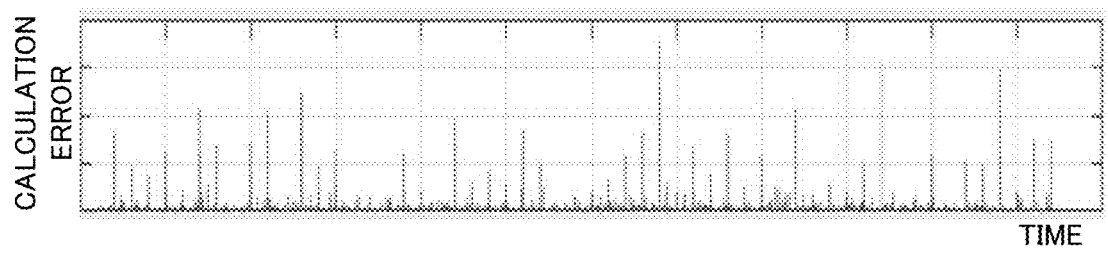
FIG. 10A is a graph illustrating a calculation error of an output signal generated by a signal processing apparatus in a second comparative example.
Figure 10B:
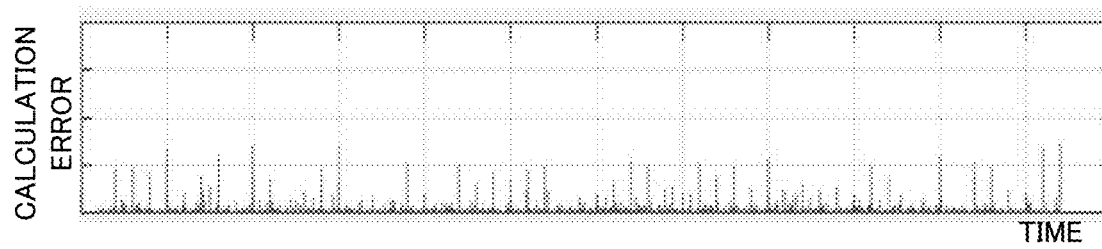
FIG. 10B is a graph illustrating a calculation error of an output signal generated by the signal processing apparatus in the second example embodiment.

As an example, FIG. 10A is a graph illustrating the calculation error of the output signal OS generated by the signal processing apparatus in the second comparative example, and FIG. 10B is a graph illustrating the calculation error of the output signal OS generated by the signal processing apparatus 1b in the second example embodiment. As is seen in FIG. 10A and FIG. 10B, as compared with the operation error of the output signal OS generated by the signal processing apparatus in the second comparative example, the calculation error of the output signal OS generated by the signal processing apparatus 1b in the second example embodiment is reduced.

It can be said that the signal processing apparatus 1b in the second example embodiment generates one output signal block OSB that substantially reflects a result obtained from one delta sigma modulation circuit 122 processing one input signal block ISB (i.e., one output signal block OSB) and the circuit state of another delta sigma modulation circuit 122 that processes another input signal block ISB located immediately after the one input signal block ISB, by adjusting the gain. In this viewpoint, the signal processing apparatus 1b in the second example embodiment may be considered to be the same as the signal processing apparatus 1a in the first example embodiment. That is, both the signal processing apparatus 1a in the first example embodiment and the signal processing apparatus 1b in the second example embodiment may be considered to mitigate the discontinuity of the signal, by generating one output signal block OSB that reflects the result obtained from one delta sigma modulation circuit 122 processing one input signal block ISB (i.e., one output signal block OSB) and the circuit state of another delta sigma modulation circuit 122 that processes another input signal block ISB located immediately after the one input signal block ISB.

The gain adjustment unit 123b, as illustrated in FIG. 9, may adjust the gain so as to gradually reduce the gain that is used when the delta-sigma modulation circuit 122 processes the end signal-block part EISB. For example, the gain adjustment unit 123b may adjust the gain so as to reduce the gain to 95% of the initial value, then reduce the gain to 85% of the initial value, then reduce the gain to 75% of the initial value, and then reduce the gain to 65% of the initial value. In this case, the discontinuity of the signal is more properly mitigated. Here, when the gain is adjusted (i.e., changed), the calculation error of the output signal OS (especially, the calculation error of a signal component corresponding to the end signal block part EISB) increases. Therefore, gradually performing the adjustment of the gain, which may lead to the calculation error, makes it possible to reduce the calculation error as much as possible, which is advantageous. Furthermore, providing an upper limit to the adjustment of the gain, which may lead to the calculation error, does not cause a significant calculation error, which is also advantageous.

<3> MODIFIED EXAMPLES

<3-1> First Modified Example

As described above, the delta-sigma modulation circuit illustrated in FIG. 3 (the second-order error feedback type delta-sigma modulation circuit) is merely an example of the delta-sigma modulation circuit 122 that is available in the signal processing apparatus 1. The delta-sigma modulation circuit 122, however, is not limited to the delta-sigma modulation circuit illustrated in FIG. 3 and FIG. 8. That is, the signal processing apparatus 1 may include a delta-sigma modulation circuit 122 that is different from the delta-sigma modulation circuit illustrated in FIG. 3 and FIG. 8.

Figure 11:
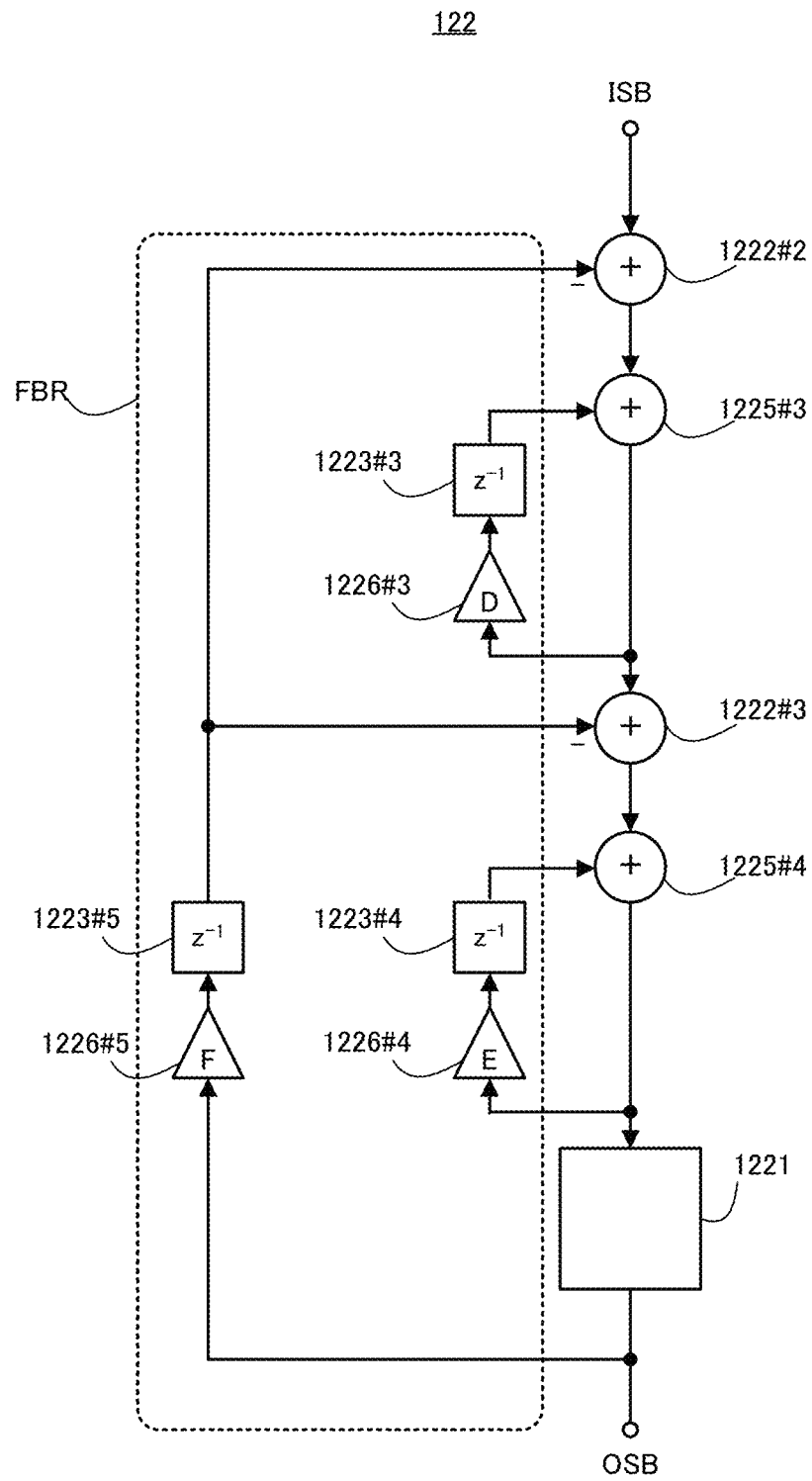
FIG. 11 is a block diagram illustrating another example of the configuration of the delta-sigma modulation circuit.

For example, as illustrated in FIG. 11 illustrating a configuration of the delta-sigma modulation circuit 122 in a modified example, the delta-sigma modulation circuit 122 may include the 1-bit quantizer 1221, a subtracter 1222 #2, a subtracter 1222 #3, a delay unit 1223 #3, a delay unit 1223 #4, a delay unit 1223 #5, an adder 1225 #3, an adder 1225 #4, an amplifier 1226 #3, an amplifier 1226 #4, and an amplifier 1226 #5. The subtractor 1222 #2, the subtractor 1222 #3, and the delay unit 1223 #5 function as a differentiator (a delta circuit) that delays the output signal block OSB outputted from the delta-sigma modulation circuit 122 by one clock and reflects it in the input signal block ISB. The delay unit 1223 #3 and the adder 1225 #3 function as a primary integrator (a sigma circuit) that integrates a signal. The delay unit 1223 #4 and the adder 1225 #4 function as a secondary integrator (a sigma circuit) that integrates a signal.

Even in this case, the signal processing apparatus 2b in the second example embodiment may adjust the magnitude of the feedback signal that is fed back to an input through a feedback path FBR, by using the gain adjustment unit 123b. In the example illustrated in FIG. 11, the signal processing apparatus 2b may adjust at least one of a gain D of the amplifier 1226 #3 that is configured to control a magnitude of a signal inputted to (stored in) the delay unit 1223 #3, a gain E of the amplifier 1226 #4 that is configured to control a magnitude of a signal inputted to (stored in) the delay unit 1223 #4, and a gain F of the amplifier 1226 #5 that is configured to control a magnitude of a signal inputted to (stored in) the delay unit 1223 #5, by using the gain adjustment unit 123b. That is, the signal processing apparatus 2b in the second example embodiment is capable of enjoying the above-described benefits, as long as it is allowed to adjust the magnitude of the feedback signal that is fed back to the input through the feedback path FBR, by using the gain adjustment unit 123b.

<3-1> Second Modified Example

The functions of the signal processing apparatus 1 described above may be realized by software. The functions of the signal processing apparatus 1 described above may be realized by hardware. The functions of the signal processing apparatus 1 described above may be realized by a combination of software and hardware. A program code (an instruction) that constitutes the software may be stored in a computer-readable recording medium disposed inside or outside the signal processing apparatus 1, for example. The program code may be read into a memory at an execution time thereof, and may be executed by a processor. A computer-readable, non-transitory recording medium on which program code is recorded, may also be provided.

Figure 12:
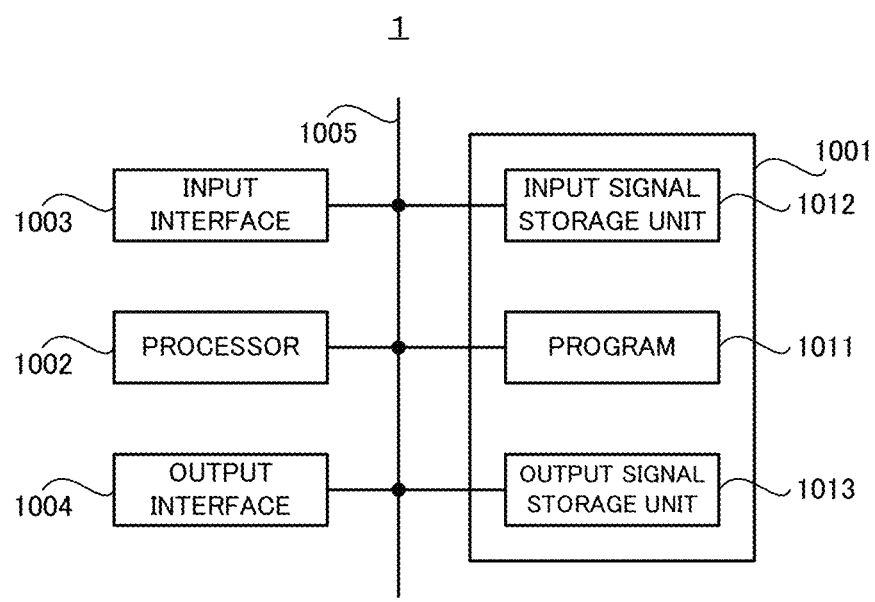
FIG. 12 is a block diagram illustrating a combination of software and hardware that realize functions of the signal processing apparatus.

For example, FIG. 12 illustrates an example of the combination of software and hardware that realizes the functions of the signal processing apparatus 1. The signal processing apparatus 1 may also include a memory 1001 that is a non-transitory recording medium, a processor 1002, an input interface 1003, and an output interface 1004. The memory 1001, the processor 1002, the input interface 1003, and the output interface 1004 may be connected to each other through an internal bus 1005. The memory 1001 may record a program (a program code) 1001 that realizes functional blocks of the signal processing apparatus 1 (specifically, the distribution unit 11, the parallel circuit unit 12, and the coupling unit 13, or the distribution unit 11b, the parallel circuit unit 12b, and the coupling unit 13b). Furthermore, the memory 1001 may include an input signal storage unit 1012 that temporarily stores a signal inputted (e.g., the input signal IS) to the signal processing apparatus 1 through the input interface 1003, and an output signal storage unit 1013 that temporarily stores a signal outputted (e.g., the output signal OS) from the signal processing apparatus 1 through the output interface 1004. The program code that realizes the functional blocks of the signal processing apparatus 1 is executed by the processor 2003. Consequently, the functional blocks of the signal processing apparatus 1 may be realized or implemented in the processor 1002.

<4> SUPPLEMENTARY NOTES

With respect to the example embodiments described above, the following Supplementary Notes are further disclosed.

[Supplementary Note 1]

A signal processing apparatus that generates an output signal from an input signal, the signal processing apparatus including:

- a distribution unit that divides the input signal into a plurality of input signal blocks, each having a predetermined data length, and that distributes, in dividing order, the plurality of divided input signal blocks to a plurality of delta-sigma modulation circuits;
- a parallel circuit unit including the plurality of delta-sigma modulation circuits that perform delta-sigma modulation on the plurality of input signal blocks and that output a plurality of output signal blocks; and
- a coupling unit that couples the plurality of output signal blocks outputted from the parallel circuit unit, thereby to generate an output signal, wherein
- the signal processing apparatus generates the output signal such that
- a first output signal block included in the output signal reflects
- a result obtained from a first delta-sigma modulation circuit, which performs delta-sigma modulation on a first input signal block corresponding to the first output signal block included in the output signal, performing delta-sigma modulation on the first input signal block, and
- a state of a second delta-sigma modulation circuit that performs delta-sigma modulation on a second input signal block located immediately before or after the first input signal block.

[Supplementary Note 2]

The signal processing apparatus according to Supplementary Note 1, wherein the distribution unit adds, to an end of the second input signal block, overlap data having a predetermined first length from a beginning of the first input signal block located immediately after the second input signal block, and distributes the second input signal block to which the overlap data is added, to the second delta-sigma modulation circuit, and the coupling unit calculates at least a part of the first output signal block, on the basis of a result obtained from the first delta-sigma modulation circuit performing delta-sigma modulation on the overlap data of the first input signal block, and a result obtained from the second delta-sigma modulation circuit performing delta-sigma modulation on the overlap data added to the second input signal block, thereby to generate the output signal including the first output signal block that reflects the state of the second delta-sigma modulation circuit.

[Supplementary Note 3]

The signal processing apparatus according to Supplementary Note 2, wherein the coupling unit calculates, as at least a part of the first output signal block, an average value/mean value of the result obtained from the first delta-sigma modulation circuit performing delta-sigma modulation on the overlap data and the result obtained from the second delta-sigma modulation circuit performing delta-sigma modulation on the overlap data.

[Supplementary Note 4]

The signal processing apparatus according to any one of Supplementary Notes 1 to 3, wherein
  the parallel circuit unit controls a state of the first delta-sigma modulation circuit such that the state of the first delta-sigma modulation circuit that performs delta-sigma modulation on a signal block part having a predetermined second length from an end of the first input signal block, is brought closer to an initial state of the second delta-sigma modulation circuit that perform delta-sigma modulation on the second input signal block, and
  the coupling unit generates the output signal including the first output signal block that is generated by the first delta-sigma modulation circuit whose state is controlled by the parallel circuit unit performing delta-sigma modulation on the first input signal block, thereby to generate the output signal including the first output signal block that reflects the state of the second delta-sigma modulation circuit.

[Supplementary Note 5]

The signal processing apparatus according to Supplementary Note 4, wherein the first delta-sigma modulation circuit controls the state of the first delta-sigma modulation circuit by changing a gain for controlling a magnitude of a feedback signal that is fed back in the first delta-sigma modulation circuit.

[Supplementary Note 6]

A signal processing method that generates an output signal from an input signal, the signal processing method including:
  dividing the input signal into a plurality of input signal blocks, each having a predetermined data length;
  distributing, in dividing order, the plurality of divided input signal blocks to a plurality of delta-sigma modulation circuits that perform delta-sigma modulation on the plurality of input signal blocks and that output a plurality of output signal blocks; and
  coupling the plurality of output signal blocks outputted, thereby to generate an output signal, wherein
  the signal processing method generates the output signal such that
  a first output signal block included in the output signal reflects
  a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

[Supplementary Note 7]

A non-transitory recording medium recording thereon a computer program that allows a computer to execute a signal processing method that generates an output signal from an input signal, the signal processing method including:
  dividing the input signal into a plurality of input signal blocks, each having a predetermined data length;
  distributing, in dividing order, the plurality of divided input signal blocks to a plurality of delta-sigma modulation circuits that perform delta-sigma modulation on the plurality of input signal blocks and that output a plurality of output signal blocks; and
  coupling the plurality of output signal blocks outputted, thereby to generate an output signal, wherein
  the signal processing method generates the output signal such that
  a first output signal block included in the output signal reflects
  a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

This disclosure is not limited to the above-described examples and is allowed to be changed, if desired, without departing from the essence or spirit of the invention which can be read from the claims and the entire specification. A signal processing apparatus, a signal processing method, and a recording medium with such changes, are also included in the technical concepts of this disclosure.

DESCRIPTION OF REFERENCE NUMERALS 1, 1a, 1b Signal processing apparatus
11, 11b Distribution unit
12, 12b Parallel circuit unit
123b Gain adjustment unit
122 Delta-sigma modulation circuit
13, 13b Coupling unit
IS Input signal
ISB Input signal block
OS Output signal
OSB Output signal block
OD Overlap data

What is claimed is:

1. A signal processing apparatus that generates an output signal from an input signal, the signal processing apparatus comprising:
  a signal distributor unit that divides the input signal into a plurality of input signal blocks, each having a predetermined data length, and that distributes, in dividing order, the plurality of divided input signal blocks to a plurality of delta-sigma modulation circuits;
  a modulator including the plurality of delta-sigma modulation circuits that perform delta-sigma modulation on the plurality of input signal blocks and that output a plurality of output signal blocks; and
  a signal coupler that couples the plurality of output signal blocks outputted from the modulator, thereby to generate an output signal, wherein
  the signal processing apparatus generates the output signal such that a first output signal block included in the output signal reflects
    a result obtained from a first delta-sigma modulation circuit, which performs delta-sigma modulation on a first input signal block corresponding to the first output signal block included in the output signal, performing delta-sigma modulation on the first input signal block, and
    a state of a second delta-sigma modulation circuit that performs delta-sigma modulation on a second input signal block located immediately before or after the first input signal block.

2. The signal processing apparatus according to claim 1, wherein
    the signal distributer adds, to an end of the second input signal block, overlap data having a predetermined first length from a beginning of the first input signal block located immediately after the second input signal block, and distributes the second input signal block to which the overlap data is added, to the second delta-sigma modulation circuit, and
    the signal coupler calculates at least a part of the first output signal block, on the basis of a result obtained from the first delta-sigma modulation circuit performing delta-sigma modulation on the overlap data of the first input signal block, and a result obtained from the second delta-sigma modulation circuit performing delta-sigma modulation on the overlap data added to the second input signal block, thereby to generate the output signal including the first output signal block that reflects the state of the second delta-sigma modulation circuit.

3. The signal processing apparatus according to claim 2, wherein the signal coupler calculates, as at least a part of the first output signal block, an average value of the result obtained from the first delta-sigma modulation circuit performing delta-sigma modulation on the overlap data and the result obtained from the second delta-sigma modulation circuit performing delta-sigma modulation on the overlap data.

4. The signal processing apparatus according to claim 1, wherein
    the modulator controls a state of the first delta-sigma modulation circuit such that the state of the first delta-sigma modulation circuit that performs delta-sigma modulation on a signal block part having a predetermined second length from an end of the first input signal block, is brought closer to an initial state of the second delta-sigma modulation circuit that perform delta-sigma modulation on the second input signal block, and
    the signal coupler generates the output signal including the first output signal block that is generated by the first delta-sigma modulation circuit whose state is controlled by the modulator performing delta-sigma modulation on the first input signal block, thereby to generate the output signal including the first output signal block that reflects the state of the second delta-sigma modulation circuit.

5. The signal processing apparatus according to claim 4, wherein the first delta-sigma modulation circuit controls the state of the first delta-sigma modulation circuit by changing a gain for controlling a magnitude of a feedback signal that is fed back in the first delta-sigma modulation circuit.

6. A signal processing method that generates an output signal from an input signal, the signal processing method comprising:
    dividing the input signal into a plurality of input signal blocks, each having a predetermined data length;
    distributing, in dividing order, the plurality of divided input signal blocks to a plurality of delta-sigma modulation circuits that perform delta-sigma modulation on the plurality of input signal blocks and that output a plurality of output signal blocks; and
    coupling the plurality of output signal blocks outputted, thereby to generate an output signal, wherein
    the signal processing method generates the output signal such that
    a first output signal block included in the output signal reflects
        a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

7. The signal processing method according to claim 6, wherein
    the dividing the input signal includes adding, to an end of the second input signal block, overlap data having a predetermined first length from a beginning of the first input signal block located immediately after the second input signal block, and distributing the second input signal block to which the overlap data is added, to the second delta-sigma modulation circuit, and
    the coupling the plurality of output signal blocks includes calculating at least a part of the first output signal block, on the basis of a result obtained from the first delta-sigma modulation circuit performing delta-sigma modulation on the overlap data of the first input signal block, and a result obtained from the second delta-sigma modulation circuit performing delta-sigma modulation on the overlap data added to the second input signal block, thereby to generate the output signal including the first output signal block that reflects the state of the second delta-sigma modulation circuit.

8. The signal processing method according to claim 7, wherein the calculating at least a part of the first output signal block includes calculating, as at least a part of the first output signal block, an average value of the result obtained from the first delta-sigma modulation circuit performing delta-sigma modulation on the overlap data and the result obtained from the second delta-sigma modulation circuit performing delta-sigma modulation on the overlap data.

9. The signal processing method according to claim 6 further comprising controlling a state of the first delta-sigma modulation circuit such that the state of the first delta-sigma modulation circuit that performs delta-sigma modulation on a signal block part having a predetermined second length from an end of the first input signal block, is brought closer to an initial state of the second delta-sigma modulation circuit that perform delta-sigma modulation on the second input signal block, and
    coupling the plurality of output signal blocks includes generating the output signal including the first output signal block that is generated by the first delta-sigma modulation circuit whose state is controlled performing delta-sigma modulation on the first input signal block, thereby to generate the output signal including the first output signal block that reflects the state of the second delta-sigma modulation circuit.

10. The signal processing method according to claim 9, wherein the first delta-sigma modulation circuit controls the state of the first delta-sigma modulation circuit by changing a gain for controlling a magnitude of a feedback signal that is fed back in the first delta-sigma modulation circuit.

11. A non-transitory recording medium recording thereon a computer program that allows a computer to execute a signal processing method that generates an output signal from an input signal, the signal processing method including:
- dividing the input signal into a plurality of input signal blocks, each having a predetermined data length;
- distributing, in dividing order, the plurality of divided input signal blocks to a plurality of delta-sigma modulation circuits that perform delta-sigma modulation on the plurality of input signal blocks and that output a plurality of output signal blocks; and
- coupling the plurality of output signal blocks outputted, thereby to generate an output signal, wherein
- the signal processing method generates the output signal such that
- a first output signal block included in the output signal reflects
- a result obtained from a first delta-sigma modulation circuit, which performs delta-sigma modulation on a first input signal block corresponding to the first output signal block, performing delta-sigma modulation on the first input signal block, and a state of a second delta-sigma modulation circuit that performs delta-sigma modulation on a second input signal block located immediately before or after the first input signal block.

* * * * *